(12) United States Patent
Yoo et al.

(10) Patent No.: US 9,902,855 B2
(45) Date of Patent: Feb. 27, 2018

(54) CURABLE POLYSILOXANE COMPOSITION FOR OPTICAL DEVICE, ENCAPSULATING MATERIAL AND OPTICAL DEVICE

(71) Applicant: CHEIL INDUSTRIES INC., Gumi-si, Gyeongsangbuk-do (KR)

(72) Inventors: Hong-Jung Yoo, Suwon-si (KR); Young-Ho Kim, Suwon-si (KR); Woo-Han Kim, Suwon-si (KR); Dong-Ju Shin, Suwon-si (KR); Dong-Il Han, Uiwang-si (KR)

(73) Assignee: CHEIL INDUSTRIES, INC., Gumi-Si, Gyeongsangbuk-Do (KR)

( * ) Notice: Subject to any disclaimer, the term of this patent is extended or adjusted under 35 U.S.C. 154(b) by 0 days.

(21) Appl. No.: 14/650,164

(22) PCT Filed: Dec. 6, 2013

(86) PCT No.: PCT/KR2013/011299
§ 371 (c)(1),
(2) Date: Jun. 5, 2015

(87) PCT Pub. No.: WO2014/088370
PCT Pub. Date: Jun. 12, 2014

(65) Prior Publication Data
US 2015/0368468 A1 Dec. 24, 2015

(30) Foreign Application Priority Data

Dec. 7, 2012 (KR) .................. 10-2012-0142101
Apr. 2, 2013 (KR) .................. 10-2013-0035988

(51) Int. Cl.
*C08L 83/06* (2006.01)
*C08L 83/04* (2006.01)
*H01L 33/56* (2010.01)
*C08L 83/14* (2006.01)
*H01L 33/50* (2010.01)
*C08G 77/12* (2006.01)
*C08G 77/20* (2006.01)

(52) U.S. Cl.
CPC ............. *C08L 83/06* (2013.01); *C08L 83/04* (2013.01); *C08L 83/14* (2013.01); *H01L 33/56* (2013.01); *C08G 77/12* (2013.01); *C08G 77/20* (2013.01); *H01L 33/501* (2013.01); *H01L 2224/48091* (2013.01)

(58) Field of Classification Search
CPC ......... C08G 77/12; C08G 77/20; C08G 77/46
See application file for complete search history.

(56) References Cited

U.S. PATENT DOCUMENTS

2004/0152858 A1* 8/2004 Kamohara .............. C08L 83/04
528/25

FOREIGN PATENT DOCUMENTS

| CN | 102757649 A | 10/2012 |
|---|---|---|
| CN | 102757650 A | 10/2012 |
| JP | 2005-227701 A | 8/2005 |
| JP | 2012-188628 A | 10/2012 |
| JP | 2012-197328 A | 10/2012 |
| KR | 10-2009-0099060 A | 9/2009 |
| KR | 10-2011-0125182 A | 11/2011 |
| KR | 10-1080156 B1 | 11/2011 |
| KR | 10-1152869 B1 | 6/2012 |
| KR | 10-2012-0078614 A | 7/2012 |
| KR | 10-2012-0080141 A | 7/2012 |
| KR | 10-2012-0120005 A | 11/2012 |
| KR | 10-2012-0122942 A | 11/2012 |

OTHER PUBLICATIONS

Chinese Search Report dated Jul. 26, 2016 in Corresponding Chinese Patent Application No. 201380072559.9.

* cited by examiner

Primary Examiner — Kuo-Liang Peng
(74) Attorney, Agent, or Firm — Lee & Morse P.C.

(57) ABSTRACT

Disclosed are a curable polysiloxane composition for an optical device including at least one kind of a first siloxane compound represented by Chemical Formula 1, at least one kind of a second siloxane compound having hydrogen bound to silicon (Si—H) at the terminal end, and at least one kind of a third siloxane compound having an alkenyl group bound to silicon (Si-Vi) at the terminal end, an encapsulating material obtained by curing the curable polysiloxane composition for an optical device, and an optical device including the encapsulating material.

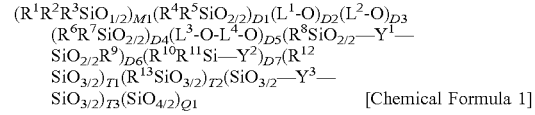

[Chemical Formula 1]

In Chemical Formula 1, $R^1$ to $R^{13}$, $Y^1$ to $Y^3$, M1, D1 to D7, T1 to T3 and Q1 are the same as defined in the specification.

18 Claims, 1 Drawing Sheet

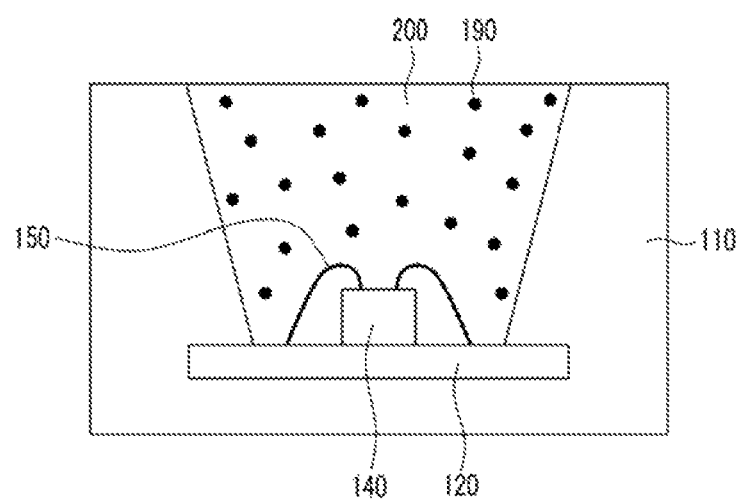

CURABLE POLYSILOXANE COMPOSITION FOR OPTICAL DEVICE, ENCAPSULATING MATERIAL AND OPTICAL DEVICE

TECHNICAL FIELD

A curable polysiloxane composition for an optical device, an encapsulating material, and an optical device are disclosed.

BACKGROUND ART

An optical device such as a light emitting diode (LED), an organic light emitting device (OLED), a photoluminescence (PL) device, and the like has been variously applied to a domestic electric device, an interior/exterior illumination device of automobiles, a display device, various automatic devices, and the like.

These optical devices may include a sealing package such as an encapsulating material to protect an optical element. This sealing package may be made from a composition including a light transmittance resin, so that light emitted from the optical elements may be externally transmitted.

DISCLOSURE

Technical Problem

One embodiment provides a curable polysiloxane composition for an optical device that improves adherence with a lower substrate and simultaneously efficiently blocks inflow of gases and moisture, improving reliability.

Another embodiment provides an encapsulating material obtained by curing the curable polysiloxane composition for an optical device.

Yet another embodiment provides an optical device including the encapsulating material.

Technical Solution

According to one embodiment, provided is a curable polysiloxane composition for an optical device including at least one kind of a first siloxane compound represented by Chemical Formula 1, at least one kind of a second siloxane compound having hydrogen bound to silicon (Si—H) at the terminal end, and at least one kind of a third siloxane compound having an alkenyl group bound to silicon (Si-Vi) at the terminal end.

$$(R^1R^2R^3SiO_{1/2})_{M1}(R^4R^5SiO_{2/2})_{D1}(L^1\text{-}O)_{D2}(L^2\text{-}O)_{D3}$$
$$(R^6R^7SiO_{2/2})_{D4}(L^3\text{-}O\text{-}L^4\text{-}O)_{D5}(R^8SiO_{2/2}\text{—}Y^1\text{—}$$
$$SiO_{2/2}R^9)_{D6}(R^{10}R^{11}Si\text{—}Y^2)_{D7}(R^{12}SiO_{3/2})_{T1}$$
$$(R^{13}SiO_{3/2})_{T2}(SiO_{3/2}\text{—}Y^3\text{—}SiO_{3/2})_{T3}$$
$$(SiO_{4/2})_{Q1}$$ [Chemical Formula 1]

In Chemical Formula 1, $R^1$ to $R^{13}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $Y^1$ to $Y^3$ are each independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, $L^1$ to $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, $0 \leq M1 < 1$, $0 \leq D1 < 1$, $0 \leq D2 < 1$, $0 \leq D3 < 1$, $0 \leq D4 < 1$, $0 \leq D5 < 1$, $0 \leq D6 < 1$, $0 \leq D7 < 1$, $0 \leq T1 < 1$, $0 \leq T2 < 1$, $0 \leq T3 < 1$, and $0 \leq Q1 < 1$, D2 and D5 are not simultaneously 0, and $M1+D1+D2+D3+D4+D5+D6+D7+T1+T2+T3+Q1=1$.

The first siloxane compound may be represented by Chemical Formula 2.

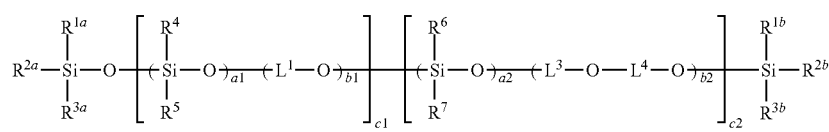

[Chemical Formula 2]

In Chemical Formula 2, $R^{1a}$, $R^{2a}$, $R^{3a}$, $R^{1b}$, $R^{2b}$, $R^{3b}$ and $R^4$ to $R^7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $L^1$, $L^3$ and $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, $0 \leq a1$, $a2 \leq 1000$, $0 \leq b1$, $b2 \leq 10$ and $0 \leq c1$, $c2 \leq 100$, b1 and b2 are not simultaneously 0, and c1 and c2 are not simultaneously 0.

At least one of the $R^{1a}$, $R^{2a}$, $R^{3a}$, $R^{1b}$, $R^{2b}$, $R^{3b}$ and $R^4$ to $R^7$ may include hydrogen or a substituted or unsubstituted C2 to C30 alkenyl group.

At least one of the $R^{1a}$, $R^{2a}$, $R^{3a}$, $R^{1b}$, $R^{2b}$, $R^{3b}$ and $R^4$ to $R^7$ may include a substituted or unsubstituted C6 to C20 aryl group.

The first siloxane compound may be represented by Chemical Formula 3 or Chemical Formula 4.

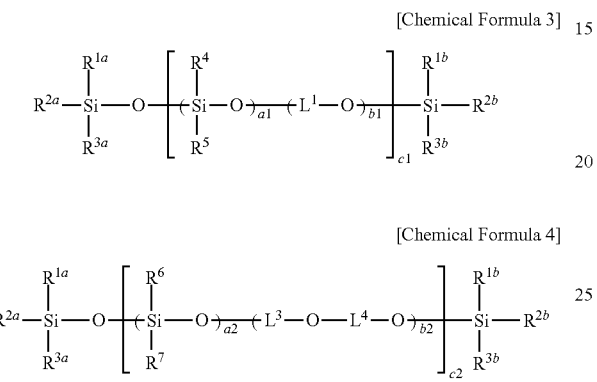

[Chemical Formula 3]

[Chemical Formula 4]

In Chemical Formula 3 or 4, $R^{1a}$, $R^{2a}$, $R^{3a}$, $R^{1b}$, $R^{2b}$, $R^{3b}$ and $R^4$ to $R^7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $L^1$, $L^3$ and $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, and $0 \leq a1$, $a2 \leq 1000$, $0 < b1$, $b2 \leq 10$ and $0 < c1$, $c2 \leq 100$.

The $L^1$, $L^3$ and $L^4$ may be each independently a substituted or unsubstituted C1 to C5 alkylene group.

The $L^1$ may be a substituted or unsubstituted ethylene group or a substituted or unsubstituted propylene group, and one of the $L^3$ and $L^4$ may be a substituted or unsubstituted ethylene group and the other may be a substituted or unsubstituted propylene group.

The first siloxane compound may be represented by Chemical Formulae 5 to 8.

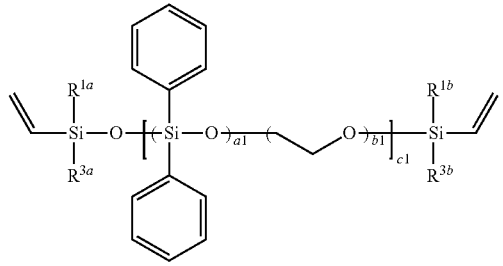

[Chemical Formula 5]

[Chemical Formula 6]

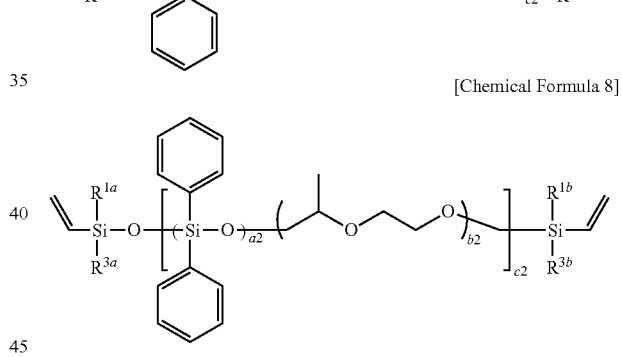

[Chemical Formula 7]

[Chemical Formula 8]

In Chemical Formulae 5 to 8, $R^{1a}$, $R^{3a}$, $R^{1b}$, $R^{3b}$, a1, a2, b1, b2, c1 and c2 are the same as described above.

The first siloxane compound may be represented by Chemical Formula 9.

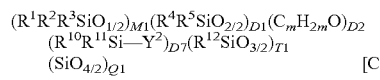

[Chemical Formula 9]

In Chemical Formula 9, $R^1$ to $R^5$ and $R^{10}$ to $R^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $Y^2$ are each independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, m is an integer ranging from 1 to 5, $0 \leq M1 < 1$, $0 \leq D1 < 1$, $0 < D2 < 1$, $0 < D7 < 1$, $0 \leq T1 < 1$, $0 \leq Q1 < 1$, and $M1 + D1 + D2 + D7 + T1 + Q1 = 1$.

At least one of $R^1$ to $R^5$ and $R^{10}$ to $R^{12}$ of Chemical Formula 9 may include hydrogen or a substituted or unsubstituted C2 to C30 alkenyl group.

At least one of $R^1$ to $R^5$ and $R^{10}$ to $R^{12}$ of Chemical Formula 9 may include a substituted or unsubstituted C6 to C30 aryl group.

The m of Chemical Formula 9 may be 2 or 3.

The second siloxane compound may be represented by Chemical Formula 10.

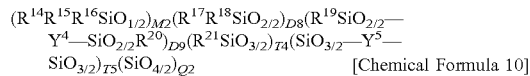

[Chemical Formula 10]

In Chemical Formula 10, $R^{14}$ to $R^{21}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, at least one of $R^{14}$ to $R^{21}$ includes hydrogen, $Y^4$ and $Y^5$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, $0 < M2 < 1$, $0 \leq D8 < 1$, $0 \leq D9 < 1$, $0 \leq T4 < 1$, $0 \leq T5 < 1$, $0 \leq Q2 < 1$, and $M2 + D8 + D9 + T4 + T5 + Q2 = 1$.

The third siloxane compound may be represented by Chemical Formula 11.

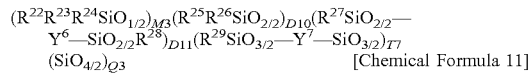

[Chemical Formula 11]

In Chemical Formula 11

$R^{22}$ to $R^{29}$ are each independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, at least one of $R^{22}$ to $R^{29}$ includes a substituted or unsubstituted C2 to C30 alkenyl group, $Y^6$ and $Y^7$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, $0 < M3 < 1$, $0 \leq D10 < 1$, $0 \leq D11 < 1$, $0 \leq T6 < 1$, $0 \leq T7 < 1$, $0 \leq Q3 < 1$, and $M3 + D10 + D11 + T6 + T7 + Q3 = 1$.

The second siloxane compound may be included in an amount of less than 50 parts by weight based on 100 parts by weight of the second siloxane compound and the third siloxane compound, and the third siloxane compound may be included in an amount of larger than 50 parts by weight based on 100 parts by weight of the second siloxane compound and the third siloxane compound.

The first siloxane compound may be included in an amount of about 0.01 to 20 wt % based on the total amount of the composition.

According to another embodiment, an encapsulating material obtained by curing the curable polysiloxane composition for an optical device is provided.

According to another embodiment, an optical device including the encapsulating material is provided.

Advantageous Effects

Adherence with a lower substrate may be improved and simultaneously inflow of gases and moisture and color changes may be efficiently blocked and thereby reliability of an encapsulating material may be improved.

DESCRIPTION OF DRAWINGS

FIG. 1 is a schematic cross-sectional view showing a light emitting diode according to one embodiment.

BEST MODE

Exemplary embodiments of the present invention will hereinafter be described in detail, and may be easily performed by those who have common knowledge in the related art. However, this disclosure may be embodied in many different forms and is not construed as limited to the exemplary embodiments set forth herein.

In the present specification, when a definition is not otherwise provided, the term "substituted" refers to one substituted with at least a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

In the present specification, when a definition is not otherwise provided, the prefix "hetero" refers to one including at least one heteroatoms selected from N, O, S, and P.

In the present specification, an optical device may include a photo-semiconductor device such as a light emitting diode (LED) and a display device such as a liquid crystal display (LCD)/an organic light emitting device (OLED).

Hereinafter, a curable polysiloxane composition for an optical device according to one embodiment is described.

A curable polysiloxane composition for an optical device (hereinafter, referred to be as a 'composition') according to one embodiment includes at least one kind of a first siloxane compound represented by Chemical Formula 1, at least one kind of a second siloxane compound having hydrogen bound to silicon (Si—H) at the terminal end, and at least one kind of a third siloxane compound having an alkenyl group bound to silicon (Si-Vi) at the terminal end.

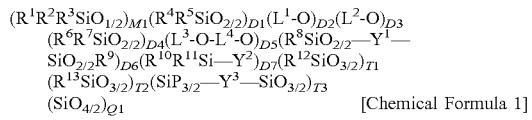

[Chemical Formula 1]

In Chemical Formula 1, $R^1$ to $R^{13}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $Y^1$ to $Y^3$ are each independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, $L^1$ to $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, $0 \le M1 < 1$, $0 \le D1 < 1$, $0 \le D2 < 1$, $0 \le D3 < 1$, $0 \le D4 < 1$, $0 \le D5 < 1$, $0 \le D6 < 1$, $0 \le D7 < 1$, $0 \le T1 < 1$, $0 \le T2 < 1$, $0 \le T3 < 1$ and $0 \le Q1 < 1$, D2 and D5 are not simultaneously 0, and $M1+D1+D2+D3+D4+D5+D6+D7+T1+T2+T3+Q1=1$ The first siloxane compound is included as one kind of additive and thus, may reduce lifting or delamination by increasing close contacting properties with a lower substrate when the composition is coated.

The first siloxane compound may increase surface tension and surface flatness and improve a surface coating effect of a cured product during curing of the composition. Accordingly, an encapsulating material obtained by curing the composition may effectively prevent gases and moisture from externally inflowing as well as shows excellent close contacting property with a lower substrate and thus, effectively prevent penetration of an exterior contamination material such as sulfur and moisture and improve reliability. In addition, the first siloxane compound may reduce viscosity of the composition and improve processibility.

In addition, the first siloxane compound has a siloxane structure which increases structural affinity for a second siloxane compound having hydrogen bound to silicon (Si—H) and a third polysiloxane having an alkenyl group bound to silicon (Si-Vi)), and thus, may prevent phase-separation of an additive in the composition.

The first siloxane compound may be, for example represented by Chemical Formula 2.

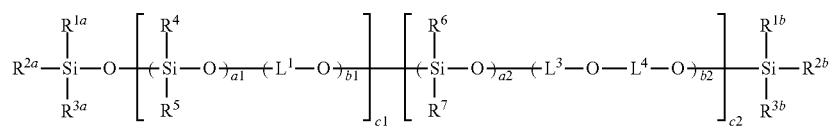

[Chemical Formula 2]

In Chemical Formula 2, $R^{1a}$, $R^{2a}$, $R^{3a}$, $R^{1b}$, $R^{2b}$, $R^{3b}$ and $R^4$ to $R^7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $L^1$, $L^3$ and $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, or a substituted or unsubstituted C2 to C30 alkynylene group, or a combination thereof, $0 \le a1$, $a2 \le 1000$, $0 \le b1$, $b2 \le 10$ and $0 \le c1$, $c2 \le 100$, b1 and b2 are not simultaneously 0, and c1 and c2 are not simultaneously 0.

In Chemical Formula 2, at least one of $R^{1a}$, $R^{2a}$, $R^{3a}$, $R^{1b}$, $R^{2b}$, $R^{3b}$ and $R^4$ to $R^7$ at the terminal end may include hydrogen or a substituted or unsubstituted C2 to C30 alkenyl group. The hydrogen or the substituted or unsubstituted C2 to C30 alkenyl group at the terminal end may perform a hydrosilylation reaction by reacting with the second siloxane compound or the third siloxane compound that will be described later.

In Chemical Formula 2, at least one of the $R^{1a}$, $R^{2a}$, $R^{3a}$, $R^{1b}$, $R^{2b}$, $R^{3b}$ and $R^4$ to $R^7$ may include a substituted or unsubstituted C6 to C30 aryl group. The substituted or unsubstituted C6 to C30 aryl group may increase a refractive index.

In Chemical Formula 1 or 2, $L^1$, $L^3$ and $L^4$ may be, for example independently a substituted or unsubstituted C1 to C5 alkylene group. For example, $L^1$ may be a substituted or unsubstituted ethylene group or a substituted or unsubstituted propylene group, and one of $L^3$ and $L^4$ may be a substituted or unsubstituted ethylene group and the other may be a substituted or unsubstituted propylene group.

The first siloxane compound may be, for example represented by Chemical Formula 3 or Chemical Formula 4.

[Chemical Formula 3]

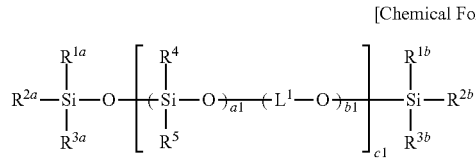

[Chemical Formula 4]

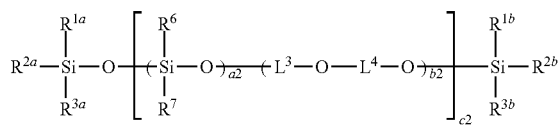

In Chemical Formula 3 or 4,
$R^{1a}$, $R^{2a}$, $R^{3a}$, $R^{1b}$, $R^{2b}$, $R^{3b}$, $R^4$ to $R^7$, $L^1$, $L^3$ and $L^4$ are the same as described above, $0 \leq a1, a2 \leq 1000$, $0 < b1, b2 \leq 10$ and $0 < c1, c2 \leq 100$.

In Chemical Formula 3 or 4, $L^1$, $L^3$ and $L^4$ may be, for example each independently a substituted or unsubstituted C1 to C5 alkylene group. For example, $L^1$ may be a substituted or unsubstituted ethylene group or a substituted or unsubstituted propylene group, and one of the $L^3$ and $L^4$ may be a substituted or unsubstituted ethylene group and the other may be a substituted or unsubstituted propylene group.

The first siloxane compound may be, for example represented by Chemical Formulae 5 to 8.

[Chemical Formula 5]

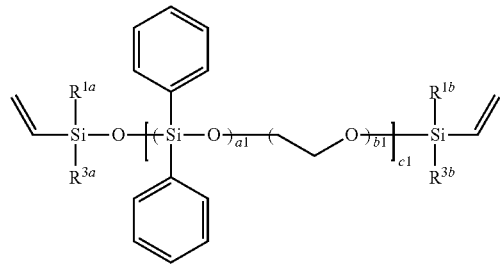

[Chemical Formula 6]

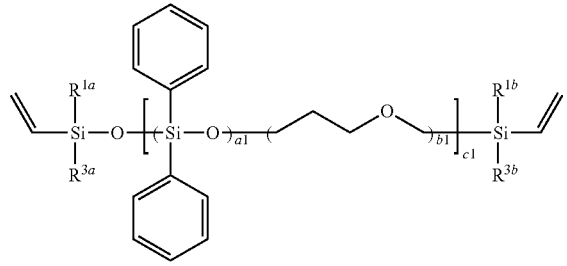

[Chemical Formula 7]

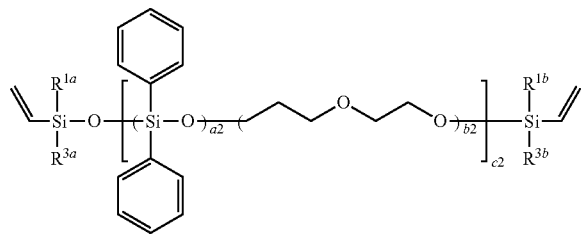

[Chemical Formula 8]

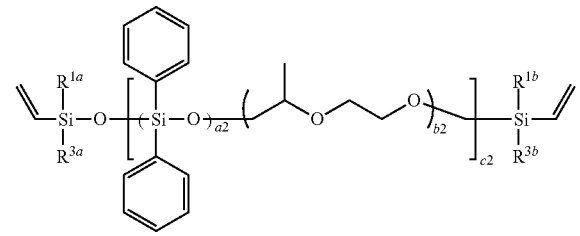

In Chemical Formulae 5 to 8, $R^{1a}$, $R^{3a}$, $R^{1b}$, $R^{3b}$, a1, a2, b1, b2, c1 and c2 are the same as described above.

For example $R^{1a}$, $R^{3a}$, $R^{1b}$ and $R^{3b}$ may be each independently hydrogen, a substituted or unsubstituted C1 to C30 alkyl group, a1, a2, b1, b2, c1 and c2 may be $0 < a1, a2 \leq 10$, $0 < b1, b2 \leq 10$ and $0 < c1, c2 \leq 100$.

The first siloxane compound may be represented by Chemical Formula 9.

$(R^1R^2R^3SiO_{1/2})_{M1}(R^4R^5SiO_{2/2})_{D1}(C_mH_{2m}O)_{D2}$
$(R^{10}R^{11}Si-Y^2)_{D7}(R^{12}SiO_{3/2})_{T1}$
$(SiO_{4/2})_{Q1}$   [Chemical Formula 9]

In Chemical Formula 9,
$R^1$ to $R^5$, $R^{10}$ to $R^{12}$ and $Y^2$ are the same as described above,
m is an integer ranging from 1 to 5, $0 \leq M1 < 1$, $0 \leq D1 < 1$, $0 < D2 < 1$, $0 < D7 < 1$, $0 \leq T1 < 1$, and $0 \leq Q1 < 1$.

At least one of $R^1$ to $R^5$ and $R^{10}$ to $R^{12}$ of Chemical Formula 9 may include hydrogen or a substituted or unsubstituted C2 to C30 alkenyl group. The hydrogen or the substituted or unsubstituted C2 to C30 alkenyl group at the terminal end may perform a hydrosilylation reaction by reacting with the second siloxane compound or the third siloxane compound that will be described later.

At least one of $R^1$ to $R^5$ and $R^{10}$ to $R^{12}$ of Chemical Formula 9 may include a substituted or unsubstituted C6 to C30 aryl group. The substituted or unsubstituted C6 to C30 aryl group may increase a refractive index.

In Chemical Formula 9, m may be 2 or 3. When the m is 2, the first siloxane compound may include a moiety that ethylene oxides are connected as a chain, and when the m is 3, and the first siloxane compound may include a moiety that propylene oxides are connected as a chain.

The first siloxane compound may be obtained, for example, through hydrolysis and/or condensation polymerization of a silane monomer.

For example, the first siloxane compound represented by Chemical Formula 1 may be obtained, for example, through hydrolysis and condensation polymerization of a monomer represented by $R^1R^2R^3SiA^1$, a monomer represented by $R^4R^5SiA^2A^3$, a monomer represented by $L^1$-O, a monomer represented by $L^2$-O, a monomer represented by $R^6R^7SiA^4A^5$, a monomer represented by $L^3$-O-$L^4$-O, a monomer represented by $A^6A^7R^8Si$—$Y^1$—$SiR^9A^8A^9$, a monomer represented by $R^{12}SiA^{10}A^{11}A^{12}$, a monomer represented by $A^{16}A^{17}A^{18}Si$—$Y^3$—$SiA^{19}A^{20}A^{21}$ and/or a monomer represented by $SiA^{22}A^{23}A^{24}A^{25}$. Herein, $R^1$ to $R^{13}$, $Y^1$ and $Y^3$ are the same as described above, and $A^1$ to $A^{25}$ are each independently C1 to C6 alkoxy group, a hydroxy group, a halogen, a carboxyl group, or a combination thereof.

The first siloxane compound may be used as one or a mixture of two or more.

The first siloxane compound may be included in an amount of about 0.01 to 20 wt % based on the total weight of the composition. When the first siloxane compound is included within the range, the composition may not have an influence on physical characteristics of an encapsulating material such as a refractive index, hardness, transmittance, heat resistance, but improve adherence and effectively block gas and moisture. Preferably, the first siloxane compound may be included in an amount of about 0.1 to 10 wt % within the range, about 0.1 to 5 wt % within the range, or about 0.1 to 1 wt % within the range.

The second siloxane compound may be, for example represented by Chemical Formula 10.

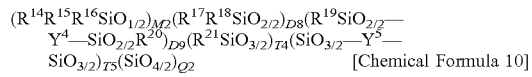  [Chemical Formula 10]

In Chemical Formula 10, $R^{14}$ to $R^{21}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, at least one of $R^{14}$ to $R^{21}$ includes hydrogen, $Y^4$ and $Y^5$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, 0<$M2$<1, 0≤$D8$<1, 0≤$D9$<1, 0≤$T4$<1, 0≤$T5$<1, and $M2+D8+D9+T4+T5+Q2=1$.

The second siloxane compound is a compound having hydrogen bound to silicon (Si—H) at the terminal end and for example, at least two hydrogens bound to silicon (Si—H) per a molecule on the average. The hydrogen bound to silicon (Si—H) may react with an alkenyl group at the terminal end of the post-described third siloxane compound. In addition, the hydrogen bound to silicon (Si—H) may react with an alkenyl group at the terminal end of the first siloxane compound, when the first siloxane compound includes the alkenyl group at the terminal end.

At least one of $R^{14}$ to $R^{21}$ of Chemical Formula 10 may include a substituted or unsubstituted C6 to C30 aryl group. Accordingly, optical properties may be ensured by increasing a refractive index.

The second siloxane compound may be obtained, for example, through hydrolysis and condensation polymerization of a monomer represented by $R^{14}R^{15}R^{16}SiA^{26}$, with at least one selected from a monomer represented by $R^{17}R^{18}SiA^{27}A^{28}$, a monomer represented by $A^{29}A^{30}A^{31}R^{19}Si$—$Y^4$—$SiR^{20}A^{32}A^{33}A^{34}$, a monomer represented by $R^{21}SiA^{35}A^{36}A^{37}$, a monomer represented by $A^{38}A^{39}A^{40}Si$—$Y^5$—$SiA^{41}A^{42}A^{43}$ and/or a monomer represented by $SiA^{44}A^{45}A^{46}A^{47}$. Herein $R^{14}$ to $R^{21}$ are the same as described above, and $A^{26}$ to $A^{47}$ are independently C1 to C6 alkoxy group, a hydroxy group, a halogen, a carboxyl group, or a combination thereof.

The second siloxane compound may be used as one or a mixture of two or more.

The third siloxane compound may be represented by for example Chemical Formula 11.

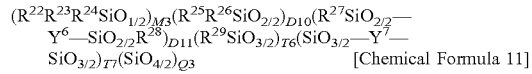  [Chemical Formula 11]

In Chemical Formula 11

$R^{22}$ to $R^{29}$ are each independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, at least one of $R^{22}$ to $R^{29}$ includes a substituted or unsubstituted C2 to C30 alkenyl group, $Y^6$ and $Y^7$ are independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0<$M3$<1, 0≤$D10$<1, 0≤$D11$<1, 0≤$T6$<1, 0≤$T7$<1, 0≤$Q3$<1, and $M3+D10+D11+T6+T7+Q3=1$.

The third siloxane compound has an alkenyl group (Si-Vi) at the terminal end and may have, for example, at least two silicon-bonded alkenyl groups (Si-Vi) per a molecule on the average. The alkenyl group bound to silicon (Si-Vi) may react with hydrogen at the terminal end of the second siloxane compound. In addition, when the first siloxane compound includes hydrogen at the terminal end, it may react with hydrogen at the terminal end of the first siloxane compound.

At least one of $R^{22}$ to $R^{29}$ of Chemical Formula 11 may include a substituted or unsubstituted C6 to C30 aryl group. Accordingly, optical properties may be secured by increasing a refractive index.

The third siloxane compound may be, for example, obtained through hydrolysis and condensation polymerization of a monomer represented by $R^{22}R^{23}R^{24}SiA^{48}$, with at least one selected from a monomer represented by $R^{25}R^{26}SiA^{49}A^{50}$, a monomer represented by $A^{51}A^{52}A^{53}R^{27}Si-Y^{6}-SiR^{28}A^{54}A^{55}A^{56}$, a monomer represented by $R^{29}SiA^{57}A^{58}A^{59}$, a monomer represented by $A^{60}A^{61}A^{62}Si-Y^{7}-SiA^{63}A^{64}A^{65}$, and a monomer represented by $SiA^{60}A^{61}A^{62}A^{63}$. Herein, $R^{22}$ to $R^{29}$ are the same as defined above, and $A^{48}$ to $A^{63}$ are each independently a C1 to C6 alkoxy group, a hydroxy group, a halogen, a carboxyl group, or a combination thereof.

The third siloxane compound may be used as one or a mixture of two or more.

The second and third siloxane compounds may respectively have each weight average molecular weight ranging from about 100 to 1,000,000, about 100 to 100,000 within the range, or about 100 to 50,000 within the range.

The second siloxane compound may be included in an amount of less than about 50 parts by weight, for example about 1 to 35 parts by weight based on the total amount, 100 parts by weight of the second siloxane compound and the third siloxane compound.

The third siloxane compound may be included in an amount of greater than about 50 parts by weight, for example about 65 to 99 parts by weight based on the total amount, 100 parts by weight of the second siloxane compound and the third siloxane compound.

The composition may further include a filler.

The filler may be made of inorganic oxide, for example zirconia, silica, alumina, titanium oxide, zinc oxide or a combination thereof.

The composition may further include a hydrosilylation catalyst. The hydrosilation catalyst may accelerate the hydrosilylation reaction of the second siloxane compound and the third siloxane compound, and it may include, for example platinum, rhodium, palladium, ruthenium, iridium, or a combination thereof. The hydrosilylation catalyst may be included in an amount of about 0.1 ppm to about 1000 ppm based on the total amount of the composition.

The composition may be cured by be heat-treated at a predetermined temperature and thus may be used as an encapsulating material. The encapsulating material may be applied to an optical element for example a light emitting diode and an organic light emitting device.

Hereinafter, as an example of an optical element to which the encapsulating material is applied, a light emitting diode according to one embodiment is described referring to FIG. 1.

FIG. 1 is a schematic cross-sectional view of a light emitting diode according to one embodiment.

Referring to FIG. 1, the light emitting diode includes a mold 110; a lead frame 120 disposed inside the mold 110; a light emitting diode chip 140 mounted on the lead frame 120; a bonding wire 150 connecting the lead frame 120 to the light emitting diode chip 140; and an encapsulating material 200 covering the light emitting diode chip 140.

The encapsulating material 200 is obtained by curing the composition. The encapsulating material 200 is formed from the composition and may adherence to the mold 110, the lead frame 120, and the light emitting diode chip 140 and thus, decrease lifting or delamination.

A phosphor 190 may be dispersed in the encapsulating material 200. The phosphor 190 includes a material stimulated by light and emitting light in an intrinsic wavelength range and largely, a quantum dot such as a semiconductor nanocrystal. The phosphor 190 may include for example a blue phosphor, a green phosphor, a red phosphor, or a mixture of more than two thereof.

The phosphor 190 may display an image in a predetermined wavelength region by light supplied from the light emitting diode chip 140 as a light emission part, and herein, the light emitting diode chip 140 may display a color in a shorter wavelength region than a color displayed in the phosphor 190. For example, when the phosphor 190 displays red, the light emitting diode chip 140 may supply blue or green in a shorter wavelength region than that of the red.

In addition, the color from the light emitting diode chip 140 and the color form the phosphor 190 may be combined and display white. For example, when the light emitting diode chip 140 supplies blue light, and the phosphor 190 includes a red phosphor and a green phosphor, the electronic device may combine blue, red, and green and thus, display white.

The phosphor 190 may be omitted.

Hereinafter, the present disclosure is illustrated in more detail with reference to examples. However, these examples are exemplary, and the present disclosure is not limited thereto.

Synthesis of First Siloxane Compound

SYNTHESIS EXAMPLE 1

122.86 g (0.49 mol) of dichlorodiphenylsilane and 238.83 g of methylene chloride were put in a 1 L 3-necked flask under a nitrogen atmosphere. Subsequently, a mixed solution from which moisture was removed of 51.49 g (0.49 mol) of diethylene glycol and 86.32 g of methylene chloride was added thereto in a dropwise fashion for one hour, while a temperature was maintained to be at 50° C. When the addition was complete, the obtained mixture was agitated for 6 hours to perform a polymerization reaction, 2.96 g (0.02 mol) of chlorodimethylvinylsilane was additionally added thereto, and the resulting mixture was heated and agitated for 2 hours. Subsequently, 200 g of distilled water and 8.4 g of sodium bicarbonate were added thereto to perform 10 times' washing. Then, the methylene chloride was removed at 40° C. under a reduced pressure, obtaining a compound represented by Chemical Formula 5a.

[Chemical Formula 5a]

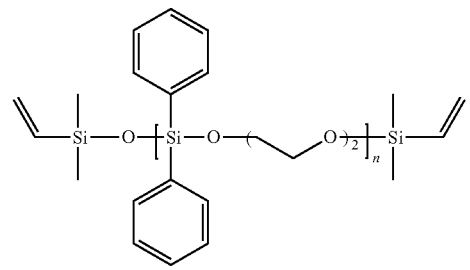

A molecular weight of the obtained compound was measured through gel permeation chromatography, and its molecular weight reduced to polystyrene was 3500 g/mol.

SYNTHESIS EXAMPLE 2

213.17 g of methylene chloride and 113.18 g (0.49 mol) of dichlorodiphenylsilane were put in a 1 L 3-necked flask under a nitrogen atmosphere. Subsequently, a mixed solution from which moisture was removed of 86.82 g (0.45 mol) of tetraethylene glycol and 86.82 g of methylene chloride was added thereto in a dropwise fashion for one hour, while a temperature was maintained to be at 50° C. When the addition was complete, the mixture was agitated for 6 hours to perform a polymerization reaction, 2.71 g (0.02 mol) of chlorodimethylvinylsilane was additionally added thereto, and the obtained mixture was heated and agitated for 2 hours. Subsequently, 200 g of distilled water and 7.56 g of sodium bicarbonate were added thereto perform 10 times' washing. Then, the methylene chloride was removed at 40° C. under a reduced pressure, obtaining a compound represented by Chemical Formula 5b.

[Chemical Formula 5b]

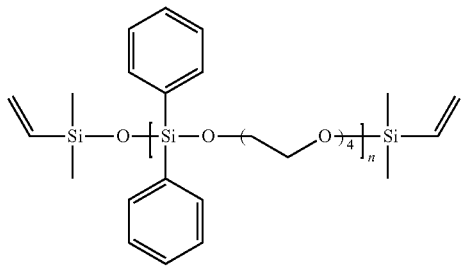

A molecular weight of the compound was measured by using gel permeation chromatography, and its molecular weight reduced to polystyrene was 4500 g/mol.

SYNTHESIS EXAMPLE 3

230.20 g of methylene chloride and 119.60 g (0.47 mol) of dichlorodiphenylsilane were put in a 1 L 3-necked flask under a nitrogen atmosphere. Subsequently, a mixed solution from which moisture was removed of 56.47 g (0.47 mol) of 3-(2-hydroxyethoxy)propan-1-ol and 86.82 g of methylene chloride were added thereto in a dropwise fashion for one hour, while a temperature was maintained to be at 50° C. When the addition was complete, the obtained mixture was agitated for 6 hours to perform a polymerization reaction, 2.71 g (0.02 mol) of chlorodimethylvinylsilane was additionally added thereto, and the mixture was heated and agitated for 2 hours. Subsequently, 200 g of distilled water and 7.90 g of sodium bicarbonate were added thereto to perform 10 times' washing. Then, the methylene chloride was removed at 40° C. under a reduced pressure, obtaining a compound represented by Chemical Formula 7a.

[Chemical Formula 7a]

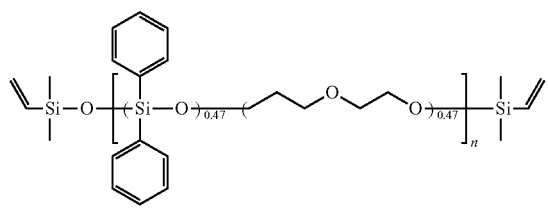

A molecular weight of the compound was measured through gel permeation chromatography, and its molecular weight reduced to polystyrene was 4800 g/mol.

SYNTHESIS EXAMPLE 4

1 kg of toluene was put in a 3-necked flask, and 1 kg of a mixture including vinyl terminated polydiphenylsiloxane and hydrogen terminated polyethylene oxide in a mole ratio of 60:40 was added thereto along with 100 ppm of Pt as a catalyst while the flask was maintained at 23° C. When the addition was complete, the mixture was heated at 50° C. for 1 hour to perform a hydrosilylation reaction. Subsequently, the resultant was cooled down to room temperature. Subsequently, the obtained polymer solution was washed with water to remove a nonreactant. Subsequently, the polymer solution was distillated under a reduced pressure to remove toluene, obtaining a compound represented by Chemical Formula 12.

$(ViPh_2SiO_{1/2})_{0.02}(Ph_2SiO_{2/2})_{0.44}(Ph_2SiCH_2CH_2)_{0.21}$
$(CH_2CH_2O)_{0.33}$ [Chemical Formula 12]

(Ph: a phenyl group, Vi: a vinyl group)

SYNTHESIS EXAMPLE 5

A compound represented by Chemical Formula 13 was synthesized according to the same method as Synthesis Example 4 except for using hydrogen terminated polypropyleneoxide instead of the hydrogen terminated polyethylene oxide.

$(ViPh_2SiO_{1/2})_{0.02}(Ph_2SiO_{2/2})_{0.38}(Ph_2SiCHCH_2)_{0.23}$
$(CHCH_3CH_2O)_{0.37}$ [Chemical Formula 13]

Synthesis of Second Siloxane Compound

SYNTHESIS EXAMPLE 6

125.41 g of toluene, 6.47 g (0.03 mol) of paratoluenesulfonic acid, 61.24 g (3.40 mol) of distilled water and 182.82 g (1.36 mol) of tetramethyl disiloxane were put in a 1 L 3-necked flask under a nitrogen atmosphere. Subsequently, 124.05 g (0.68 mol) of methylphenyldimethoxysilane were added thereto in a dropwise fashion for one hour, while the flask was maintained at 25° C. When the addition was complete, the mixture was agitated for 4 hours to perform a reaction, and 200 g of distilled water and 2.10 g of sodium bicarbonate were added thereto to perform 10 times' washing. Subsequently, toluene and a volatile matter were removed at 90° C. under a reduced pressure, obtaining a compound represented by Chemical Formula 10a.

$(Me_2HSiO_{1/2})_{0.1}(PhMeSiO_{2/2})_{0.9}$ [Chemical Formula 10a]

(Me: a methyl group and Ph: a phenyl group)

SYNTHESIS EXAMPLE 7

One kg of a mixed solvent obtained by mixing water and toluene in a weight ratio of 5:5 was put in a 3-necked flask while the flask was maintained at 23° C., and a mixture of tetramethyl disiloxane and diphenyldichlorosilane in a mole ratio of 25:75 as a monomer was added thereto in a dropwise fashion over 2 hours. When the reaction was complete, the mixture was refluxed at 23° C. for 3 hours to perform a reaction. Subsequently, an aqueous layer was removed therefrom, preparing a resulting material solution dissolved in toluene. The obtained resulting material solution was washed with water to remove chlorine as a reaction side-product. Subsequently, the neutral polymer solution was distillated under a reduced pressure to remove the toluene therefrom, obtaining polysiloxane represented by Chemical Formula 10b.

$(Me_2HSiO_{1/2})_{0.25}(Ph_2SiO_{2/2})_{0.75}$ [Chemical Formula 10b]

Synthesis of Third Siloxane Compound

SYNTHESIS EXAMPLE 8

219.29 g (1.11 mol) of toluene, 5.04 g (0.06 mol) of tetramethyl ammonium hydroxide and 31.85 g (1.77 mol) of distilled water were put in a 1 L 3-necked flask under a nitrogen atmosphere. Subsequently, 219.29 g (1.11 mol) of phenyltrimethoxysilane was added thereto in a dropwise fashion over 2 hours, while the flask was maintained at 25° C. When the addition was complete, the mixture was agitated for one hour. Subsequently, a reaction was performed for 10 hours by removing methanol as a side-product at 75° C. with Dean-Stark, decreasing its internal temperature down to 110° C. to remove water therefrom, and then, adding 40.03 g (0.33 mol) of chlorodimethylvinylsilane thereto Subsequently, 200 g of distilled water was added thereto to perform 10 times' washing. Subsequently, toluene and a volatile matter were removed at 120° C. under a reduced pressure, obtaining a compound represented by Chemical Formula 11a.

$(Me_2ViSiO_{1/2})_{0.1}(PhSiO_{3/2})_{0.9}$ [Chemical Formula 11a]

(Me: a methyl group, Vi: a vinyl group, and Ph: a phenyl group)

SYNTHESIS EXAMPLE 9

266.90 g (1.46 mol) of dimethoxymethylphenylsilane, 4.11 g (0.07 mol) of KOH and 28.99 g (1.61 mol) of distilled water were put in a 1 L 3-necked flask under a nitrogen atmosphere. After performing a reaction at 75° C. for 2 hours and then, removing methanol with Dean-Stark, the resultant was 10 times washed by adding 200 g of toluene and 200 g of distilled water thereto, and then, water was removed therefrom by decreasing its internal temperature down to 110° C. Subsequently, 8.83 g (0.073 mol) of chlorodimethylvinylsilane was added thereto to perform a reaction at 50° C. for 2 hours, and the obtained resultant was 10 times washed with 200 g of distilled water. Subsequently, toluene and a volatile matter were removed at 90° C. under a reduced pressure, obtaining a compound represented by Chemical Formula 11 b.

$(Me_2ViSiO_{1/2})_{0.1}(PhMeSiO_{2/2})_{0.9}$ [Chemical Formula 11b]

(Me: a methyl group, Vi: a vinyl group, and Ph: a phenyl group)

SYNTHESIS EXAMPLE 10

One kg of a mixed solvent obtained by mixing water and toluene in a weight ratio of 5:5 was put in a 3-necked flask, and a mixture of vinyldimethylchlorosilane, phenylmethyldichlorosilane and phenyltrichlorosilane in a mole ratio of 15:25:60 as a monomer was added thereto in a dropwise fashion over 2 hours, while the flask was maintained at 23° C. When the addition was complete, the mixture was heated and refluxed at 90° C. for 3 hours to perform a condensation polymerization reaction. Subsequently, the resultant was cooled down to room temperature, and an aqueous layer was removed therefrom, preparing a polymer solution in which the polymer was dissolved in toluene.

The obtained polymer solution was washed with water to remove a reaction side-product of chlorine. Subsequently, the neutral polymer solution was distillated under a reduced pressure to remove toluene, obtaining polysiloxane represented by Chemical Formula 11c.

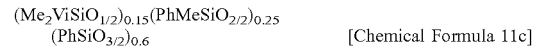

$(Me_2ViSiO_{1/2})_{0.15}(PhMeSiO_{2/2})_{0.25}(PhSiO_{3/2})_{0.6}$ [Chemical Formula 11c]

Preparation of Composition

EXAMPLE 1

3 wt % of the first siloxane compound according to Synthesis Example 1, 25 wt % of the second siloxane compound according to Synthesis Example 6, 50 wt % of the third siloxane compound according to Synthesis Example 8, 22 wt % of the third siloxane compound according to Synthesis Example 9, and a hydrosilylation catalyst, Pt-CS 2.0 (Umicore) (added up to a Pt content of 3 ppm) were mixed and foam-removed under vacuum, to prepare a curable polysiloxane composition for an optical device.

EXAMPLE 2

3 wt % of the first siloxane compound according to Synthesis Example 2, 25 wt % of the second siloxane compound according to Synthesis Example 6, 50 wt % of the third siloxane compound according to Synthesis Example 8, 22 wt % of the third siloxane compound according to Synthesis Example 9, and a hydrosilylation catalyst, Pt-CS 2.0 (Umicore) (added up to a Pt content of 3 ppm) were mixed and foam-removed under vacuum, to prepare a curable polysiloxane composition for an optical device.

EXAMPLE 3

3 wt % of the first siloxane compound according to Synthesis Example 3, 25 wt % of the second siloxane compound according to Synthesis Example 6, 50 wt % of the third siloxane compound according to Synthesis Example 8, 22 wt % of the third siloxane compound according to Synthesis Example 9, and a hydrosilylation catalyst, Pt-CS 2.0 (Umicore) (added up to a Pt content of 3 ppm) were mixed and foam-removed under vacuum, to prepare a curable polysiloxane composition for an optical device.

COMPARATIVE EXAMPLE 1

25 wt % of the second siloxane compound according to Synthesis Example 6, 50 wt % of the third siloxane compound according to Synthesis Example 8, 22 wt % of the third siloxane compound according to Synthesis Example 9, and a hydrosilylation catalyst, Pt-CS 2.0 (Umicore) (added up to a Pt content of 3 ppm) were mixed and foam-removed under vacuum, to prepare a curable polysiloxane composition for an optical device.

EXAMPLE 4

0.1 wt % of the first siloxane compound according to Synthesis Example 4, 20 wt % of the second siloxane compound according to Synthesis Example 7, 79.9 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 5

0.3 wt % of the first siloxane compound according to Synthesis Example 4, 20 wt % of the second siloxane compound according to Synthesis Example 7, 79.7 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 6

0.5 wt % of the first siloxane compound according to Synthesis Example 4, 20 wt % of the second siloxane compound according to Synthesis Example 7, 79.5 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 7

1.0 wt % of the first siloxane compound according to Synthesis Example 4, 20 wt % of the second siloxane compound according to Synthesis Example 7, 79.0 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 8

0.1 wt % of the first siloxane compound according to Synthesis Example 5, 20 wt % of the second siloxane compound according to Synthesis Example 7, 79.9 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 9

0.3 wt % of the first siloxane compound according to Synthesis Example 5, 20 wt % of the second siloxane compound according to Synthesis Example 7, 79.7 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 10

0.5 wt % of the first siloxane compound according to Synthesis Example 5, 20 wt % of the second siloxane compound according to Synthesis Example 7, 79.5 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

EXAMPLE 11

1.0 wt % of the first siloxane compound according to Synthesis Example 5, 20 wt % of the second siloxane compound according to Synthesis Example 7, 79.0 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

COMPARATIVE EXAMPLE 2

20 wt % of the second siloxane compound according to Synthesis Example 7, 80.0 wt % of the third siloxane compound according to Synthesis Example 10, and a hydrosilylation catalyst, Pt-CS 2.0 (Umicore) (added up to a Pt content of 5 ppm) were mixed and foam-removed under vacuum, to prepare a curable polysiloxane composition for an optical device.

Evaluation

Viscosity, a refractive index, light transmittance, hardness, adherence, sulfur resistance, moisture permeability, and oxygen permeability of the curable polysiloxane compositions for an optical device according to Examples 1 to 11 and Comparative Examples 1 and 2 were evaluated.

The viscosity was measured by using Brookfield (DV-II+ pro) spindle No. 52 at 25° C. at torque of 90%.

The refractive index of the curable polysiloxane compositions for an optical device according to Examples 1 to 11 and Comparative Examples 1 and 2 were measured by using an Abbe refractive index meter under a wavelength of D-line 589 nm.

The light transmittance was measured by preparing cured specimens having each thickness of 4 mm using the curable polysiloxane compositions for an optical device according to Examples 1 to 11 and Comparative Examples 1 and 2, and thermally curing the same at 150° C. for 2 hours, and then using UV-spectrophotometer (Shimazu Corporation UV-3600).

The hardness was measured by respectively injecting the curable polysiloxane compositions for an optical device according to Examples 1 to 11 and Comparative Examples 1 and 2 in a mold (2.5 cm (width)×7.5 cm (length)×1 cm (thickness)) coated with TEFLON (tetrafluoroethylene), sequentially curing the compositions at 150° C. for 2 hours, and cooling them down to room temperature and using a Shore A hardness meter.

The adherence was evaluated as follows.

A polytetrafluoroethylene spacer (width: 10 mm, length: 20 mm, thickness: 1 mm) was inserted between two silver (width: 25 mm, length: 50 mm, thickness: 1 mm), each curable polysiloxane composition for an optical device according to Examples 1 to 11 and Comparative Examples 1 and 2 was filled in a space left between the silver specimens, and the silver specimens were fixed with a clip. Subsequently, the silver specimens were allowed to stand in a 150° C. oven for 2 hours to cure the compositions. Then, the silver specimens were cooled down to room temperature, put in a tension tester (3367, Instron Co.) after removing the clip and the spacer, and pulled toward the opposite horizontal direction to measure a stress at a moment when the specimens were broken.

The sulfur resistance was measured as follows.

The curable polysiloxane compositions for an optical device according to Examples 1 to 11 and Comparative Examples 1 and 2 and a phosphor were put in an LED PKG (Samsung Electronics 5630 PKG), were cured at 150° C. for 2 hours, and were cooled to room temperature to prepare package samples. Subsequently, initial luminances of the package samples were measured by using integrating sphere (Instrument Systems, CAS 140 CT). Then, a sulfur mixture including 0.7 g of $K_2S$ and 50 g of $H_2O$ was prepared in a 250 ml glass bottle. Subsequently, the glass bottle and the package sample were respectively disposed at the top and bottom of a 50° C. water double-boiling container and allowed to stand for 8 hours, and the package sample was taken out thereof to measure luminance, compare the luminance with its initial luminance and thus, evaluate its sulfur resistance.

The motion reliability was measured as follows.

The curable polysiloxane compositions for an optical device according to Examples 1 to 11 and Comparative Examples 1 and 2 were put in LED PKG (Samsung Electronics 5630 PKG), were heat-treated at 80° C. for 1 hour, and then at 120° C. for 1 hour and at 160° C. for 1 hour, and were cooled to room temperature to prepare package samples. Subsequently, initial luminances of the package samples were measured by using integrating sphere (Instrument Systems, CAS 140 CT). Then, the package samples are connected to PCB (patterned circuit board) by soldering (Surface mount technique). Then, the PCB connected to the package sample was put in a constant temperature and humidity chamber under a condition of 85° C./85 RH %, and then, the operation state of a light emitting diode was examined, while a current was flown thereinto. After 1000 hours, luminance of the package sample was remeasured by using an integrating sphere, and a decrease rate of the luminance relative to the initial luminance was calculated.

The moisture permeability and the oxygen transmission rate were measured by preparing each cured product having a thickness of 10 mm of the curable polysiloxane compositions for an optical device according to Examples 1 to 11 and Comparative Examples 1 and 2, and curing the same at 150° C. for 5 minutes, and then, using a moisture permeability-measuring equipment (ASTM F-1249, ASTM D-3985) made by MOCON Inc.

The results are provided in Tables 1 to 3.

TABLE 1

| | Example 1 | Example 2 | Example 3 | Comparative Example 1 |
|---|---|---|---|---|
| Viscosity (cP) | 3308 | 3112 | 2905 | 3605 |
| Refractive index | 1.54 | 1.54 | 1.54 | 1.53 |
| Light transmittance (after curing, %) | >95 | >95 | >95 | >95 |
| Hardness (Shore A) | 90 | 91 | 90 | 90 |
| Adherence (Die shear, kgf) | 3.5 | 4.5 | 4.0 | 2.2 |
| Sulfur resistance (%) | −8.61 | −9.31 | −8.05 | −15.49 |
| Moisture permeability (gm/m²day) | 5.1 | 4.4 | 5.0 | 6.8 |
| Oxygen permeability (cc/m²day) | 377 | 325 | 359 | 411 |
| High temperature and high moisture motion reliability (%) | −3.4 | −3.8 | −2.2 | −6.7 |

TABLE 2

| | Example 4 | Example 5 | Example 6 | Example 7 | Comparative Example 2 |
|---|---|---|---|---|---|
| Viscosity (cP) | 3605 | 3376 | 2985 | 2646 | 3870 |
| Refractive index | 1.55 | 1.55 | 1.54 | 1.54 | 1.53 |
| Light transmittance (after curing, %) | >95 | >95 | >95 | >95 | >95 |
| Hardness (Shore A) | 88 | 90 | 89 | 90 | 90 |
| Adherence (Die shear, kgf) | 4.8 | 4.7 | 4.8 | 4.8 | 2.7 |
| Sulfur resistance (%) | −11.16 | −9.31 | −8.96 | −5.54 | −16.21 |
| Moisture permeability (gm/m²day) | 6.1 | 5.4 | 4.0 | 3.8 | 7.5 |
| Oxygen permeability (cc/m²day) | 382 | 336 | 250 | 244 | 393 |
| Motion reliability (%) | −2.2 | −2.4 | −1.8 | −1.9 | −7.7 |

TABLE 3

| | Example 8 | Example 9 | Example 10 | Example 11 | Comparative Example 2 |
|---|---|---|---|---|---|
| Viscosity (cP) | 3633 | 3413 | 2992 | 2766 | 3870 |
| Refractive index | 1.54 | 1.54 | 1.54 | 1.54 | 1.53 |
| Light transmittance (after curing, %) | >95 | >95 | >95 | >95 | >95 |
| Hardness (Shore A) | 90 | 90 | 90 | 90 | 90 |
| Adherence (Die shear, kgf) | 4.6 | 4.6 | 4.6 | 4.4 | 2.7 |
| Sulfur resistance (%) | −11.99 | −10.10 | −9.22 | −5.91 | −16.21 |
| Moisture permeability (gm/m²day) | 6.2 | 5.6 | 4.3 | 3.8 | 7.5 |
| Oxygen permeability (cc/m²day) | 388 | 361 | 295 | 259 | 393 |
| Motion reliability (%) | −2.8 | −2.3 | −1.9 | −1.5 | −7.7 |

Referring to Table 1, the compositions according to Examples 1 to 4 showed similarly improved refractive index, light transmittance and hardness but remarkably improved adherence, sulfur resistance, moisture permeability and oxygen permeability compared with the composition according to Comparative Example 1.

Likewise, referring to Tables 2 and 3, the compositions according to Examples 5 to 11 showed similarly improved refractive index, light transmittance and hardness but sharply improved adherence, sulfur resistance, moisture permeability, and oxygen permeability compared with Comparative Example 2.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: mold
140: light emitting diode chip
200: encapsulating material
120: frame
150: bonding wire

The invention claimed is:

1. A curable polysiloxane composition for an optical device, the composition comprising:
at least one first siloxane compound represented by Chemical Formula 1, the first siloxane compound including a silicon-containing repeating group,
at least one second siloxane compound having a hydrogen bound to silicon (Si—H) at a terminal end thereof, and
at least one third siloxane compound having an alkenyl group bound to silicon (Si-Alkenyl) at a terminal end thereof:

$(R^1R^2R^3SiO_{1/2})_{M1}(R^4R^5SiO_{2/2})_{D1}(L^1-O)_{D2}(L^2-O)_{D3}$
$(R^6R^7SiO_{2/2})_{D4}(L^3-O-L^4-O)_{D5}(R^8SiO_{2/2}-Y^1-$
$SiO_{2/2}R^9)_{D6}(R^{10}R^{11}Si-Y^2)_{D7}(R^{12}SiO_{3/2})_{T1}$
$(R^{13}SiO_{3/2})_{T2}(SiO_{3/2}-Y^3-SiO_{3/2})_{T3}$
$(SiO_{4/2})_{Q1}$   [Chemical Formula 1]

wherein, $R^1$ to $R^{13}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $Y^1$ to $Y^3$ are each independently a single bond, a substituted or unsubstituted C1 to C30 alkylene group, a substituted or unsubstituted C3 to C30 cycloalkylene group, unsubstituted C1 to C30 heteroalkylene group, a substituted or unsubstituted C6 to C30 arylene group, a substituted or unsubstituted C3 to C30 heteroarylene group, or a combination thereof, $L^1$ to $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, $0 \le M1 < 1$, $0 \le D1 < 1$, $0 \le D2 < 1$, $0 \le D3 < 1$, $0 \le D4 < 1$,
$0 \le D5 < 1$, $0 \le D6 < 1$, $0 \le D7 < 1$, $0 \le T1 < 1$, $0 \le T2 < 1$,
$0 \le T3 < 1$, and $0 \le Q1 < 1$, D2 and D5 are not simultaneously 0, D1, D4, D6, D7, T1, T2, and T3 are not simultaneously 0, and $M1+D1+D2+D3+D4+D5+D6+D7+T1+T2+T3+Q1=1$.

2. The curable polysiloxane composition for an optical device of claim 1, wherein the first siloxane compound is represented by Chemical Formula 2:

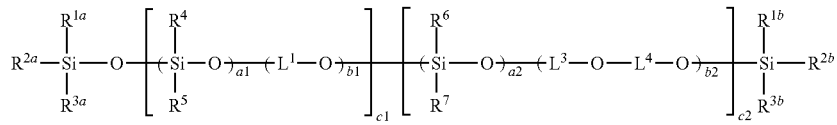

[Chemical Formula 2]

wherein, in Chemical Formula 2,
$R^{1a}$, $R^{2a}$, $R^{3a}$, $R^{1b}$, $R^{2b}$, $R^{3b}$ and $R^4$ to $R^7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $L^1$, $L^3$ and $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, $0 \le a1 \le 1000$, $0 \le a2 \le 1000$, $0 \le b1 \le 10$, $0 \le b2 \le 10$,
$0 \le c1 \le 100$, and $0 \le c2 \le 100$, a1 and a2 are not simultaneously 0, b1 and b2 are not simultaneously 0, c1 and c2 are not simultaneously 0, when one of b1 and c1 is zero, both b2 and c2 are not zero, and when one of b2 and c2 is zero, both b1 and c1 are not zero.

3. The curable polysiloxane composition for an optical device of claim 2, wherein at least one of $R^{1a}$, $R^{2a}$, $R^{3a}$, $R^{1b}$, $R^{2b}$, $R^{3b}$ and $R^4$ to $R^7$ is a substituted or unsubstituted C2 to C30 alkenyl group.

4. The curable polysiloxane composition for an optical device of claim 2, wherein at least one of $R^{1a}$, $R^{2a}$, $R^{3a}$, $R^{1b}$, $R^{2b}$, $R^{3b}$ and $R^4$ to $R^7$ is a substituted or unsubstituted C6 to C30 aryl group.

5. The curable polysiloxane composition for an optical device of claim 1, wherein the first siloxane compound is represented by one of Chemical Formula 3 or Chemical Formula 4:

[Chemical Formula 3]

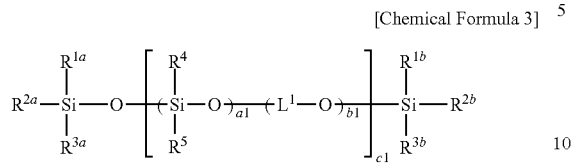

[Chemical Formula 4]

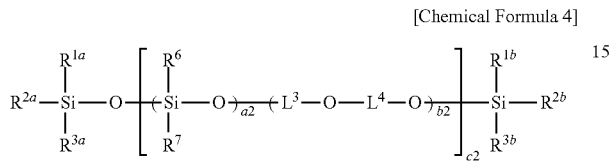

wherein, in Chemical Formulae 3 and 4, $R^{1a}$, $R^{2a}$, $R^{3a}$, $R^{1b}$, $R^{2b}$, $R^{3b}$ and $R^4$ to $R^7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, $L^1$, $L^3$ and $L^4$ are each independently substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 alkenylene group, a substituted or unsubstituted C2 to C30 alkynylene group, or a combination thereof, and $0<a1\leq1000$, $0<a2\leq1000$, $0<b1\leq10$, $0<b2\leq10$, $0<c1\leq100$, and, $0<c2\leq100$.

6. The curable polysiloxane composition for an optical device of claim 1, wherein $L^1$, $L^3$ and $L^4$ are each independently a substituted or unsubstituted C1 to C5 alkylene group.

7. The curable polysiloxane composition for an optical device of claim 1, wherein:
$L^1$ is a substituted or unsubstituted ethylene group or a substituted or unsubstituted propylene group, and
one of $L^3$ and $L^4$ is a substituted or unsubstituted ethylene group and the other is a substituted or unsubstituted propylene group.

8. The curable polysiloxane composition for an optical device of claim 1, wherein the first siloxane compound is represented by one of Chemical Formulae 5 to 8:

[Chemical Formula 5]

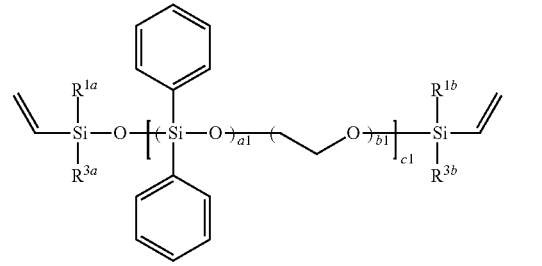

[Chemical Formula 6]

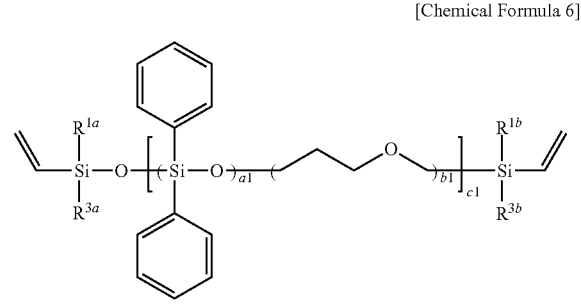

[Chemical Formula 7]

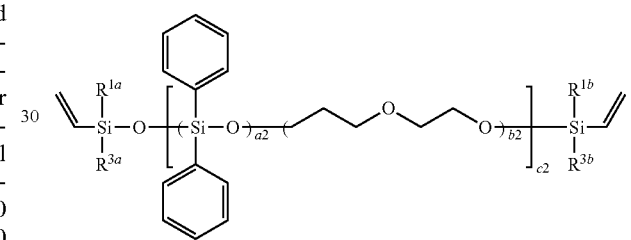

[Chemical Formula 8]

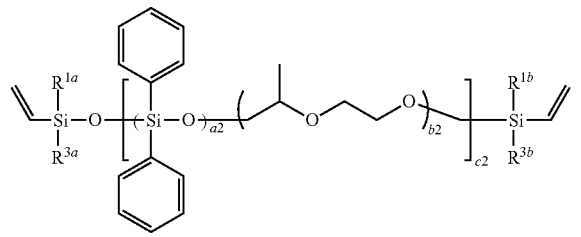

wherein, in Chemical Formulae 5 to 8, $R^{1a}$, $R^{3a}$, $R^{1b}$ and $R^{3b}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, and $0<a1\leq1000$, $0<a2\leq1000$, $0<b1\leq10$, $0<b2\leq10$, $0<c1\leq100$, and, $0<c2\leq100$.

9. The curable polysiloxane composition for an optical device of claim 1, wherein the first siloxane compound is represented by Chemical Formula 9:

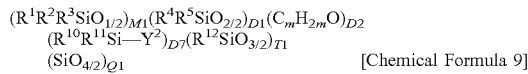

[Chemical Formula 9]

wherein, in Chemical Formula 9, $R^1$ to $R^5$ and $R^{10}$ to $R^{12}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, each $Y^2$ is independently a single bond, a substituted or unsubstituted C1 to C30 alkylene group, a substituted or unsubstituted C3 to C30 cycloalkylene group, a substituted or unsubstituted C1 to C30 heteroalkylene group, a substituted or unsubstituted C6 to C30 arylene group, a substituted or unsubstituted C3 to C30 heteroarylene group, or a combination thereof, m is an integer ranging from 1 to 5, $0 \leq M1 < 1$, $0 \leq D1 < 1$, $0 < D2 < 1$, $0 < D7 < 1$, $0 \leq T1 < 1$, $0 \leq Q1 < 1$, D1 and T1 are not simultaneously 0, and $M1+D1+D2+D7+T1+Q1=1$.

10. The curable polysiloxane composition for an optical device of claim 9, wherein at least one of $R^1$ to $R^5$ and $R^{10}$ to $R^{12}$ of Chemical Formula 9 is hydrogen or a substituted or unsubstituted C2 to C30 alkenyl group.

11. The curable polysiloxane composition for an optical device of claim 9, wherein at least one of $R^1$ to $R^5$ and $R^{10}$ to $R^{12}$ of Chemical Formula 9 is a substituted or unsubstituted C6 to C30 aryl group.

12. The curable polysiloxane composition for an optical device of claim 9, wherein m is 2 or 3.

13. The curable polysiloxane composition for an optical device of claim 1, wherein the second siloxane compound is represented by Chemical Formula 10:

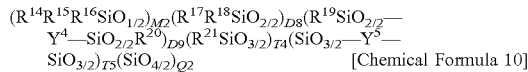

[Chemical Formula 10]

wherein, in Chemical Formula 10, $R^{14}$ to $R^{21}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, at least one of $R^{14}$ to $R^{21}$ is hydrogen, $Y^4$ and $Y^5$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C3 to C20 heteroarylene group, a substituted or unsubstituted C2 to C20 alkenylene group, a substituted or unsubstituted C2 to C20 alkynylene group, or a combination thereof, $0 < M2 < 1$, $0 < D8 < 1$, $0 < D9 < 1$, $0 < T4 < 1$, $0 < T5 < 1$, $0 < Q2 < 1$, and $M2+D8+D9+T4+T5+Q2=1$.

14. The curable polysiloxane composition for an optical device of claim 1, wherein the third siloxane compound is represented by Chemical Formula 11:

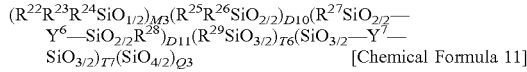

[Chemical Formula 11]

wherein, in Chemical Formula 11, $R^{22}$ to $R^{29}$ are each independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C3 to C30 heteroaryl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, a halogen atom, or a combination thereof, at least one of $R^{22}$ to $R^{29}$ is a substituted or unsubstituted C2 to C30 alkenyl group, $Y^6$ and $Y^7$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0 < M3 < 1$, $0 \leq D10 < 1$, $0 \leq D11 < 1$, $0 \leq T6 < 1$, $0 \leq T7 < 1$, $0 \leq Q3 < 1$, and $M3+D10+D11+T6+T7+Q3=1$.

15. The curable polysiloxane composition for an optical device of claim 1, wherein:
the second siloxane compound is included in an amount of less than 50 parts by weight, based on 100 parts by weight of the second siloxane compound and the third siloxane compound, and
the third siloxane compound is included in an amount of larger than 50 parts by weight, based on 100 parts by weight of the second siloxane compound and the third siloxane compound.

16. The curable polysiloxane composition for an optical device of claim 1, wherein the first siloxane compound is included in an amount of 0.01 to 20 wt %, based on a total weight of the composition.

17. An encapsulating material obtained by curing the curable polysiloxane composition for an optical device of claim 1.

18. An optical device comprising the encapsulating material of claim 17.

* * * * *